(12) United States Patent
Hochman

(10) Patent No.: US 9,799,703 B2
(45) Date of Patent: Oct. 24, 2017

(54) LINEAR LED LIGHTING FIXTURE WITH IMPROVED VIEWING ANGLE

(71) Applicant: Revolution Display, LLC, Glendale, CA (US)

(72) Inventor: Jeremy Hochman, Glendale, CA (US)

(73) Assignee: Revolution Display, LLC, Glendale, CA (US)

( * ) Notice: Subject to any disclaimer, the term of this patent is extended or adjusted under 35 U.S.C. 154(b) by 117 days.

(21) Appl. No.: 13/907,074

(22) Filed: May 31, 2013

(65) Prior Publication Data
US 2015/0116995 A1    Apr. 30, 2015

Related U.S. Application Data

(60) Provisional application No. 61/654,264, filed on Jun. 1, 2012.

(51) Int. Cl.
*H01L 27/15* (2006.01)
*F21S 4/28* (2016.01)
(Continued)

(52) U.S. Cl.
CPC .............. *H01L 27/153* (2013.01); *F21S 4/28* (2016.01); *F21Y 2103/10* (2016.08);
(Continued)

(58) Field of Classification Search
CPC ............................ F21V 23/004; F21V 23/005
USPC .. 362/249.02, 97.1, 97.2, 97.3, 231, 249.01, 362/249.06, 257, 382, 559, 561, 611, 612, 362/800
See application file for complete search history.

(56) References Cited

U.S. PATENT DOCUMENTS 7,008,079 B2 * 3/2006 Smith ........................... 362/235
7,467,877 B2   12/2008 Peng et al.
(Continued)

FOREIGN PATENT DOCUMENTS

JP       H0830213 A    2/1996
JP    2009231525 A   10/2009
(Continued)

OTHER PUBLICATIONS

International Search Report and the Written Opinion of the International Searching Authority for International Application No. PCT/US13/43720, dated Oct. 8, 2013.
(Continued)

*Primary Examiner* — Sharon Payne
(74) *Attorney, Agent, or Firm* — Downs Rachlin Martin PLLC

(57) ABSTRACT

Disclosed is an LED lighting fixture that includes a linear lighting mounting member having a first longitudinal axis and a plurality of adjacent multicolor LEDs, such as RGB LEDs, operably connected to the linear mounting member along the first axis. Each multicolor LED has a first end portion, a first LED diode configured to emit light having a first color mounted on the first end portion, an opposing second end portion, and a second LED diode configured to emit light having a second color disposed at the second, the first LED diode spaced apart from the second LED diode along a second longitudinal axis, and the orientation of each multicolor LED rotated 180° in relation to the orientation of the adjacent multicolor LED.

22 Claims, 3 Drawing Sheets

(51) Int. Cl.
   *F21Y 105/00*   (2016.01)
   *F21Y 105/12*   (2016.01)
   *F21Y 105/10*   (2016.01)
   *F21Y 103/10*   (2016.01)
   *F21Y 115/10*   (2016.01)
   *F21Y 115/15*   (2016.01)
   *F21Y 113/13*   (2016.01)
   *F21Y 113/17*   (2016.01)

(52) U.S. Cl.
   CPC ....... *F21Y 2105/00* (2013.01); *F21Y 2105/10* (2016.08); *F21Y 2105/12* (2016.08); *F21Y 2113/13* (2016.08); *F21Y 2113/17* (2016.08); *F21Y 2115/10* (2016.08); *F21Y 2115/15* (2016.08)

(56) References Cited

U.S. PATENT DOCUMENTS

| | | | |
|---|---|---|---|
| 7,722,230 B2* | 5/2010 | Chien | H04N 7/181 362/145 |
| 7,878,681 B2 | 2/2011 | Blumel et al. | |
| 2007/0014098 A1 | 1/2007 | Park et al. | |
| 2007/0291485 A1 | 12/2007 | Peng et al. | |
| 2008/0080184 A1* | 4/2008 | Cao | 362/252 |
| 2008/0111471 A1 | 5/2008 | Blumel et al. | |
| 2009/0101922 A1* | 4/2009 | Lin | F21K 9/00 257/89 |
| 2010/0172123 A1 | 7/2010 | Gomi | |
| 2011/0182065 A1* | 7/2011 | Negley | F21K 9/00 362/231 |
| 2012/0033420 A1 | 2/2012 | Kim et al. | |

FOREIGN PATENT DOCUMENTS

| | | |
|---|---|---|
| JP | 2011095759 A | 5/2011 |
| JP | 2011253158 A | 12/2011 |

OTHER PUBLICATIONS

First Office Action dated Jan. 27, 2016, in corresponding European Patent Application No. 13796850.9, filed Nov. 20, 2014.

Supplementary Search Report dated Dec. 16, 2015, in corresponding European Patent Application No. 13796850.9, filed Nov. 20, 2014.

* cited by examiner

LINEAR LED LIGHTING FIXTURE WITH IMPROVED VIEWING ANGLE

RELATED APPLICATION

This application claims priority from U.S. Provisional Application Ser. No. 61/654,264, filed on Jun. 1, 2012, entitled "LINEAR LED LIGHTING FIXTURE WITH IMPROVED VIEWING ANGLE," the entirety of which is incorporated herein by this reference.

BACKGROUND OF THE INVENTION

Field

The present invention relates generally to the electrical arts. More particularly, the invention relates to an LED lighting fixture.

Discussion of the Related Art

Because of their low energy consumption, long lifetime, improved robustness, and small size, LEDs have revolutionized lighting. Multicolor LEDs including RGB LEDs containing red, green and blue diodes, such as the multicolor LED shown in FIG. 1, are able to provide essentially all the colors of the visible spectrum.

Given this versatility, LEDs are especially useful in track lighting fixtures used at concerts, in theaters and the like. A drawback of such LED fixtures, however, is that because of the spacing between diodes in the multicolor LEDs, the color perceived by a viewer can vary depending on the angle at which the viewer looks at the LED lighting fixture. As shown in FIG. 2, in an attempt to overcome this drawback, the multicolor LEDs are mounted on the lighting fixture with each pixel formed by clusters of four multicolor LEDs, with the orientation of each LED rotated 180° in relation to the orientation of the adjacent LEDs. It is a drawback of this method that four LEDs are required to act as a single pixel. It is a still further drawback that the clusters are spaced apart by 100 mm or more, thus limiting the resolution of the LED lighting. Other drawbacks of this method include the aesthetics of lighting fixtures containing large clusters, as well as the complexity and costs of manufacturing such fixtures.

Consequently, there is a desideratum for an LED lighting fixture with an improved viewing angle and resolution. There is a further desideratum for such LED lighting fixtures that are inexpensive and simple to manufacture.

SUMMARY OF THE INVENTION

The aforementioned needs are satisfied by the linear lighting fixture of the present invention. In some aspects, an LED lighting fixture includes a linear lighting mounting member having a first longitudinal axis and a plurality of adjacent multicolor LEDs aligned along the first longitudinal axis, such as RGB LEDs, operably connected to the linear mounting member along the first axis. In some aspects, each multicolor LED has a first end portion, a first LED diode configured to emit light having a first color mounted on the first end portion, an opposing second end portion, and a second LED diode configured to emit light having a second color mounted on the second end portion, the first LED diode spaced apart from the second LED diode along a second longitudinal axis, and the orientation of each multicolor LED rotated 180° in relation to the orientation of the adjacent multicolor LEDs.

In some embodiments, the plurality of adjacent multicolor LEDs have a circular or a square or a rectangular light-emitting surface with a diameter or a length of from about 2.5 to about 5 mm in each direction. In some embodiments, the LEDs are spaced apart from about 5 mm to about 25 mm and in some embodiments from about 10 mm to about 15 mm, measured center of LED-to-center of adjacent LED. And in some embodiments, there are from about 36 to about 60 adjacent multicolor LEDs and in some embodiments, there are from about 42 to about 54 adjacent multicolor LEDs.

DETAILED DESCRIPTION OF THE PREFERRED EMBODIMENTS

Particular embodiments of the invention are described below in detail for the purpose of illustrating its principles and operation. However, various modifications may be made, and the scope of the invention is not limited to the exemplary embodiments described below.

Figure 1:
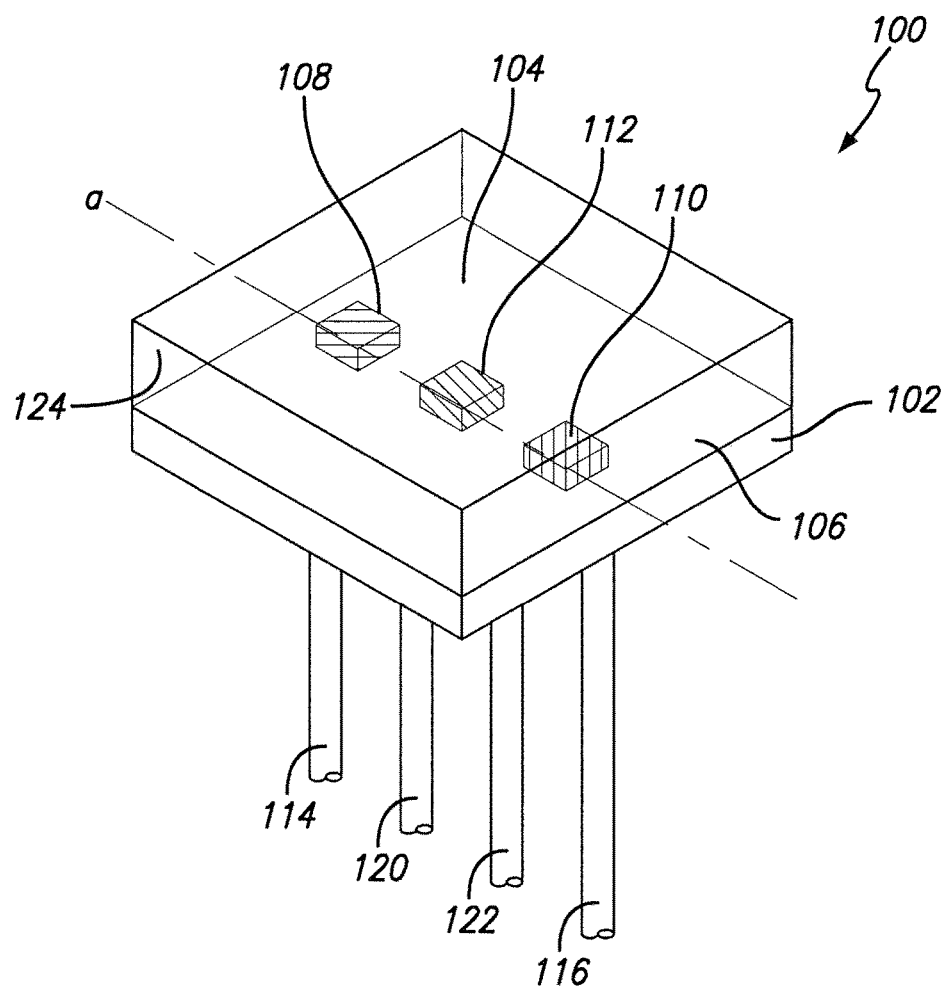
FIG. 1 is a perspective view of one embodiment of a multicolor LED for use in a linear LED lighting fixture in accordance with the invention.

Shown in FIG. 1 is a perspective view of a multicolor LED 100. Such multicolor LEDs typically can have a circular or a square or a rectangular light-emitting surface with a diameter or a length of from about 2.5 to about 5 mm in each direction. Multicolor LEDs are commercially available and typically come in 3 mm and 5 mm sizes. And in some embodiments the LED have a 3.5 mm×2.8 mm light-emitting surface.

In the representative embodiment shown in FIG. 1, the multicolor LED 100 includes a substrate 102 having a first end portion 104 and an opposing second end portion 106. Mounted on the substrate are a first LED diode 108 configured to emit light having a first color, a second LED diode 110 configured to emit light having a second color and a third LED diode 112 configured to emit light having a third color. In the exemplary multicolor LED shown in FIG. 1, the first color is blue, the second color is red and the third color is green.

The three diodes are aligned along the LEDs longitudinal axis a. A first pin 114, a second pin 116 and third pin 120 are operably connected to the first, second and third diodes, respectively. A fourth pin 122 serves as either an anode or a cathode ground. A transparent cover 124 protects the LED. It will be appreciated by one skilled the art that while an LED having red/green/blue diodes (an RGB LED) is illustrated in FIG. 1, multicolor LEDs with different numbers and different colors of diodes cam also be used. Further, while a 4-pin LED is shown in the embodiment illustrated in FIG. 1, other multicolor LEDs, such as surface mount multicolor LEDs can be used. Still further, while an LED having a square surface area is illustrated in FIG. 1, it will be appreciated that LEDs having different surface areas, such as cylindrical surface areas, can also be used.

Figure 2:
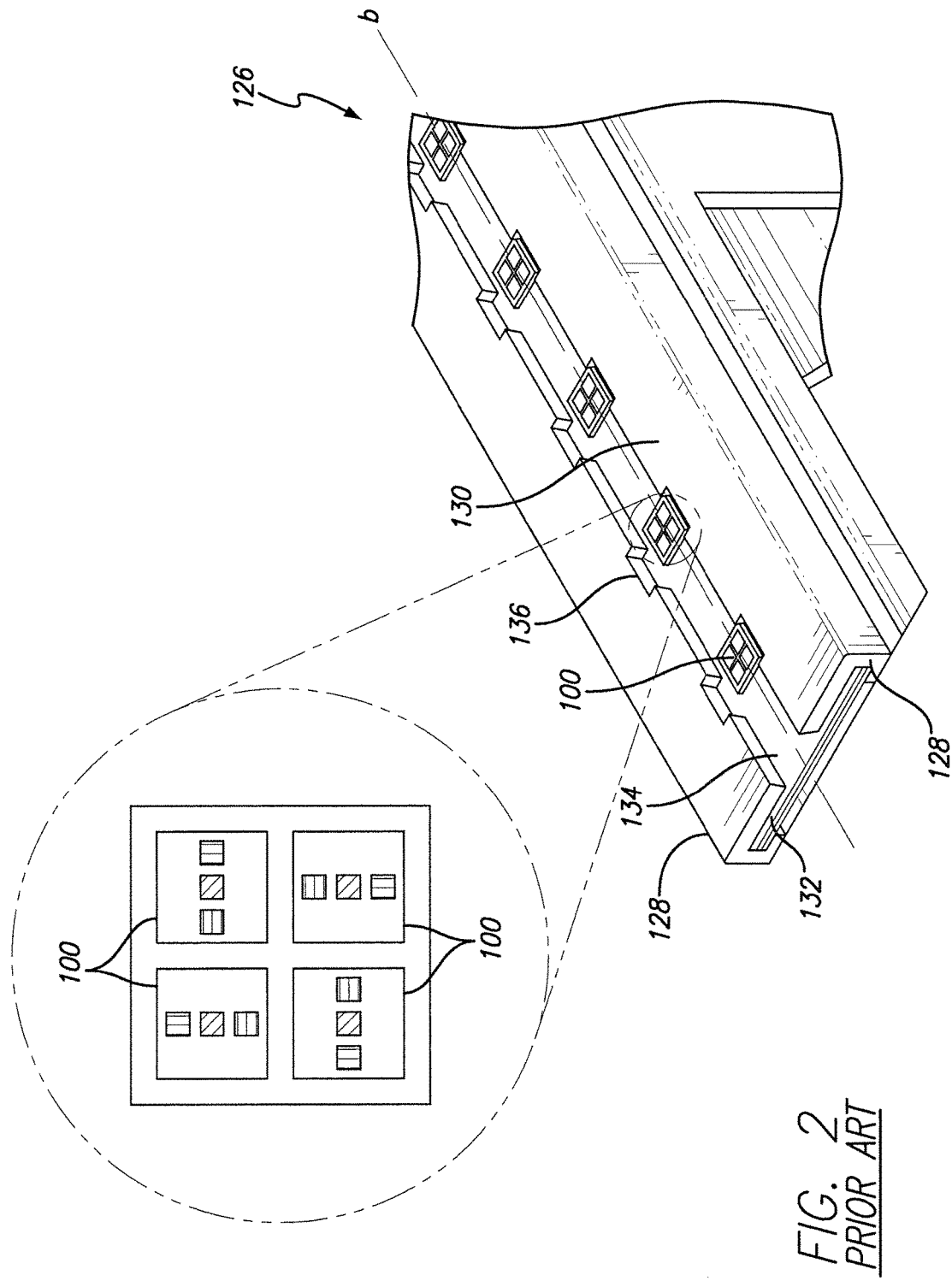
FIG. 2 is a perspective cutaway view of an LED light emitting fixture having a conventional clusters of four multicolor LEDs.

A conventional LED lighting fixture 126 is shown in FIG. 2. The linear lighting fixture includes a linear lighting mounting member 128 having a light emitting surface 130. Formed along the length of linear lighting mounting member and having a longitudinal axis b is a groove 132 with a light emitting opening 134 in the light emitting surface. Regions 136 with an increased surface area are machined at regular intervals along the longitudinal axis of the light emitting opening. The regions are dimensioned so that four multicolor LEDs 100 forming a cluster having two multicolor LEDs in each column and two multicolor LEDs in each row can be mounted in the groove and exposed by each region. For example, in embodiments where 3 mm square LEDs are used, the dimensions of the regions is greater than 6 mm in each direction, while in embodiments where 5 mm LEDs are used, the dimensions of the regions is greater than 10 mm in each direction.

Figure 3:
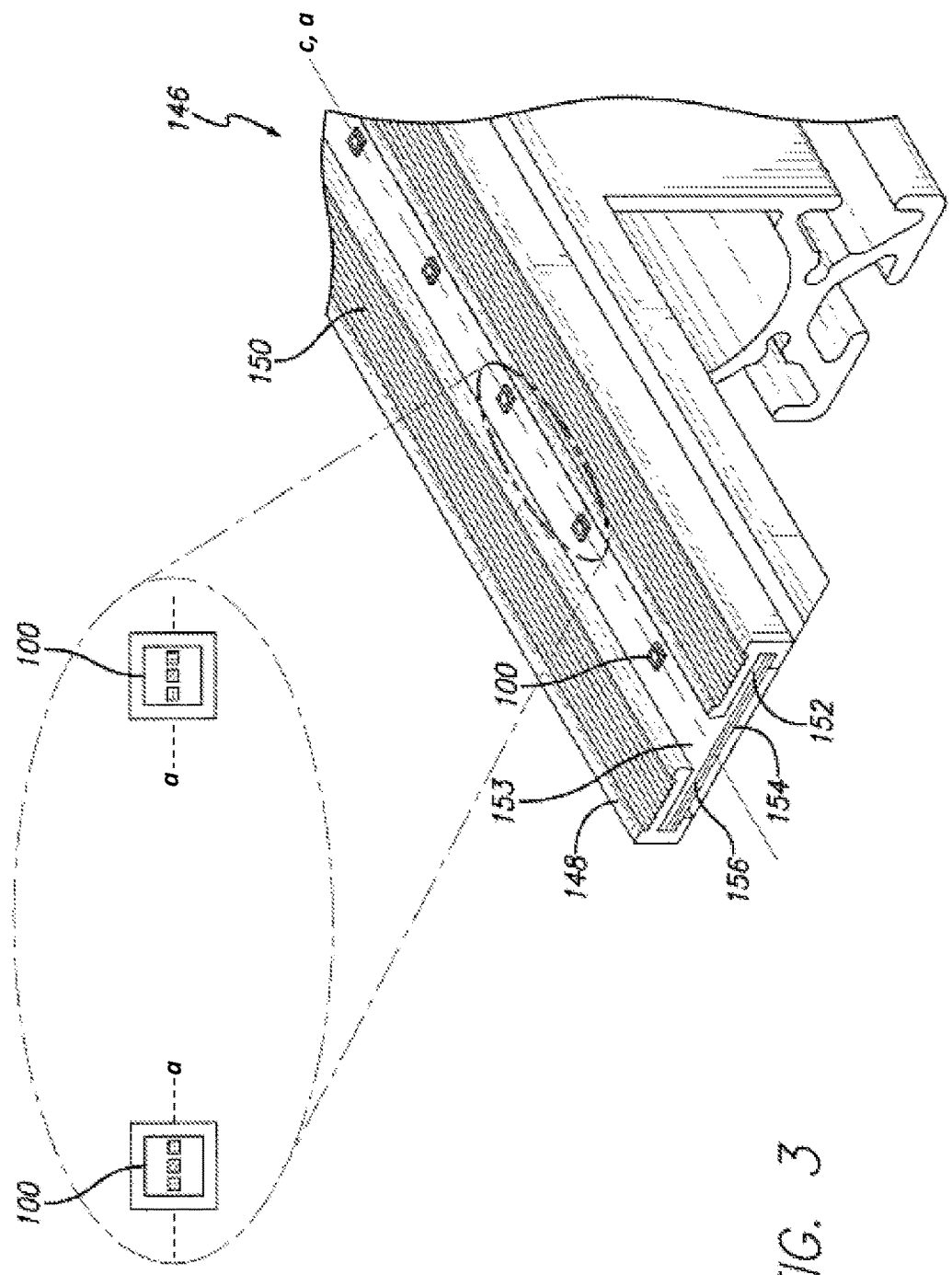
FIG. 3 is a perspective cutaway view of an LED light emitting fixture in accordance with the invention.

An LED lighting fixture 146 in accordance with the invention is shown in FIG. 3. The lighting fixture includes a linear mounting member 148 having a light emitting surface 150. Formed along the length of linear lighting mounting member and having a longitudinal axis c is a groove 152 with a light emitting opening 153 in the light emitting surface. The linear mounting member can be made out of any suitable material and in a preferred embodiment is made out of an extruded metal, such as aluminum.

A plurality of multicolor LEDs 100 are operably mounted on a printed circuit board 154 configured to fit in the groove 152. In some aspects, from about 36 to about 60 and in some aspects from about 42 to about 54 multicolor LEDs are aligned along the axis of the light emitting opening 153. The LEDs can be, for example, conventional LEDs, organic LEDs (OLEDs) or polymer LEDs (PLEDs).

The printed circuit board has a plurality of electrical contacts thereon. The electrical contacts are connected to a controller (not shown). One end of each of the electrical contacts is also coupled with one of the pins 114, 116, 120, 122 (shown in FIG. 1). The LEDs may be soldered in a conventional manner or may be the more compact surface mounted type. Thus, each LED is electrically coupled with a controller. Each LED is also coupled with a power source.

The multicolor LEDs are further secured to the printed circuit board using a potting material 156, representative potting materials include, without limitation silicone, epoxy and polyurethane potting compounds, applied to the surface of the PCB surrounding each adjacent multicolor LED.

The multicolor LEDs are spaced apart on the PCB such that adjacent multicolor LEDs are aligned along the longitudinal axis c. Furthermore, the orientation of each multicolor LED is rotated 180° in relation to the orientation of the adjacent multicolor LED to the orientation of the adjacent LEDs. In some embodiments, the LEDs are spaced apart from about 5 mm to about 25 mm and in some embodiments from about 10 mm to about 15 mm, measured center of LED-to-center of adjacent LED. In a particular embodiment, forty-eight 3.5 mm×2.8 mm RGB LEDs are spaced 12.5 mm center-to-center along a 600 mm fixture.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

I claim:

1. An LED track display fixture comprising:
an elongate linear mounting member having a first longitudinal axis; and
a plurality of adjacent multicolor LEDs mounted on the elongate linear mounting member, the plurality of adjacent multicolor LEDs for forming a plurality of pixels, each one of the plurality of pixels being formed by only a corresponding respective one of the plurality of multicolor LEDs, each multicolor LED comprising a first end portion, a first LED diode configured to emit light having a first color mounted proximate the first end portion, an opposing second end portion, and a second LED diode configured to emit light having a second color and mounted proximate the second end portion, the first LED diode being spaced apart from the second LED diode along a second longitudinal axis, wherein all of the LED diodes on a corresponding respective multicolor LED are located on the second longitudinal axis, wherein each of the plurality of multicolor LEDs are operably connected to the linear mounting member along the first axis and oriented such that the first and second axes are parallel, each of the plurality of multicolor LEDs has an orientation that is rotated 180° in relation to any adjacent multicolor LED connected to the elongate linear mounting member, the plurality of multicolor LEDs forming a one-dimensional array of multicolor LEDs and being designed and configured to generate colors that, as perceived by a viewer when viewing the LED track display fixture, do not vary with a viewing angle of the viewer.

2. The LED display fixture of claim 1, wherein the plurality of adjacent multicolor LEDs have a square or a rectangular light-emitting surface with a length of from about 2.5 to about 5 mm in each direction and the adjacent multicolor LEDs are spaced from about 5 mm to about 25 mm from one another as measured center of LED-to-center of adjacent LED.

3. The LED display fixture of claim 2, wherein the plurality of adjacent multicolor LEDs are spaced from about 10 mm to about 15 mm from one another as measured center of LED-to-center of adjacent LED.

4. The LED display fixture of claim 1, wherein the plurality of adjacent multicolor LEDs have a circular light-emitting surface with a diameter of from about 2.5 to about 5 mm in each direction and the adjacent multicolor LEDs are spaced from about 5 mm to about 25 mm from one another as measured center of LED-to-center of adjacent LED.

5. The LED display fixture of claim 4, wherein the plurality of adjacent multicolor LEDs are spaced from about 10 mm to about 15 mm from one another as measured center of LED-to-center of adjacent LED.

6. The LED display fixture of claim 1, wherein the first LED diode is a blue LED diode the second LED diode is a red LED diode and further comprising a third green LED diode.

7. The LED display fixture of claim 1, wherein there are from about 36 to about 60 adjacent multicolor LEDs.

8. The LED display fixture of claim 1, wherein there are from about 42 to about 54 adjacent multicolor LEDs.

9. The linear LED display fixture of claim 1, wherein all of the multicolor LEDs operably connected to the linear mounting member are arranged on the linear mounting member along the first longitudinal axis.

10. The linear LED display fixture of claim 1, wherein the plurality of multicolor LEDs do not have lenses.

11. The LED display fixture of claim 6, wherein there are from about 36 to about 60 adjacent multicolor LEDs.

12. The LED display fixture of claim 6, wherein there are from about 42 to about 54 adjacent multicolor LEDs.

13. A linear LED track display fixture, comprising:
an elongate linear mounting member having a longitudinal axis and a light-emitting surface with a longitudinal open-ended groove formed therein that is centered on the longitudinal axis;
a plurality of multicolor LEDs, with each multicolor LED having first, second and third LED diodes arranged in order along a second axis and that respectively emit first, second and third colors;
wherein each of the plurality of multicolor LEDs are arranged in a line on the elongate linear mounting member on the light-emitting surface and within the longitudinal groove such that the second axis of each of the multicolor LEDs is generally parallel to the longitudinal axis; and
wherein each of the plurality of multicolor LEDs is spaced apart from and rotated by 180° relative to any adjacent multicolor LED connected to the elongate linear mounting member, the plurality of multicolor LEDs forming a one-dimensional array of multicolor LEDs that are designed and configured to generate colors that, as perceived by a viewer when viewing the linear LED track display fixture, do not vary with a viewing angle of the viewer.

14. The linear LED display fixture of claim 13, wherein the first, second and third colors are red, blue and green.

15. The linear LED display fixture of claim 13, wherein there are between 36 and 60 multicolor LEDs.

16. The linear LED display fixture of claim 13, wherein the longitudinal open-ended groove does not have regions with an increased surface area proximate the multicolor LEDs.

17. The linear LED display fixture of claim 13, wherein a width of the longitudinal open-ended groove is substantially constant along an entire length of the linear mounting member.

18. The linear LED display fixture of claim 17, wherein each of the plurality of multicolor LEDs have an outermost dimension, wherein the width of the longitudinal open-ended groove is approximately the same as the outermost dimension.

19. The linear LED display fixture of claim 13, wherein the plurality of multicolor LEDs form pixels along the LED track fixture, wherein each pixel consists of only one multicolor LED.

20. The linear LED display fixture of claim 13, wherein the only LED diodes on each multicolor LED are the first, second, and third LED diodes.

21. A direct view LED track display fixture comprising:
an elongate linear mounting member having a first longitudinal axis; and
at least three multicolor LEDs mounted on the elongate linear mounting member, each of the at least three multicolor LEDs having a first LED diode configured to emit light having a first color and a second LED diode configured to emit light having a second color, wherein all of the LED diodes on a corresponding respective multicolor LED are located on a second longitudinal axis that is parallel with the first longitudinal axis;
wherein each of the at least three multicolor LEDs are operably connected to the linear mounting member along the first axis, each of the at least three multicolor LEDs have an orientation that is rotated 180° in relation to any adjacent multicolor LED connected to the elongate linear mounting member.

22. The linear LED track display fixture of claim 21, wherein the at least three multicolor LEDs form a plurality of pixels, each one of the plurality of pixels being formed by only a corresponding respective one of the at least three multicolor LEDs.

* * * * *